US009535530B2

(12) United States Patent
Cho et al.

(10) Patent No.: US 9,535,530 B2
(45) Date of Patent: Jan. 3, 2017

(54) CAPACITANCE SENSOR WITH IMPROVED NOISE FILTERING CHARACTERISTICS, METHOD FOR NOISE FILTERING OF CAPACITANCE SENSOR AND COMPUTER-READABLE RECORDING MEDIUM

(75) Inventors: Youngho Cho, Gyeonggi-do (KR); Bonkee Kim, Gyeonggi-do (KR)

(73) Assignee: HIDEEP INC. (KR)

( * ) Notice: Subject to any disclaimer, the term of this patent is extended or adjusted under 35 U.S.C. 154(b) by 560 days.

(21) Appl. No.: 13/531,879

(22) Filed: Jun. 25, 2012

(65) Prior Publication Data

US 2012/0326734 A1   Dec. 27, 2012

(30) Foreign Application Priority Data

Jun. 24, 2011 (KR) .................. 10-2011-0061468

(51) Int. Cl.
| | | |
|---|---|---|
| *G01R 27/26* | (2006.01) | |
| *G06F 3/041* | (2006.01) | |
| *G06F 3/044* | (2006.01) | |
| *H03K 17/96* | (2006.01) | |
| *G01D 3/032* | (2006.01) | |
| *G11C 27/02* | (2006.01) | |
| *H03H 19/00* | (2006.01) | |
| *G01D 5/24* | (2006.01) | |

(52) U.S. Cl.
CPC .............. *G06F 3/0416* (2013.01); *G01D 3/032* (2013.01); *G06F 3/044* (2013.01); *H03K 17/962* (2013.01); *G01D 5/24* (2013.01); *G11C 27/026* (2013.01); *H03H 19/004* (2013.01); *H03K 2217/960705* (2013.01); *H03K 2217/960725* (2013.01)

(58) Field of Classification Search
CPC ........ G06F 3/041; G06F 3/044; G06F 3/0416; G06F 3/0418; G06F 3/0412; G01D 3/08; G01D 3/032; G01D 5/24; G01R 27/26; G01R 27/2605; H03K 17/962; G01P 15/125; G01C 19/5719; H01L 27/323
USPC ........... 324/650–690; 345/173; 327/100–333
See application file for complete search history.

(56) References Cited

U.S. PATENT DOCUMENTS 5,920,309 A * 7/1999 Bisset et al. .................. 345/173
6,323,846 B1  11/2001 Westerman et al.
(Continued)

FOREIGN PATENT DOCUMENTS

| JP | 5355935 | 5/1978 |
|---|---|---|
| JP | 59231677 | 12/1984 |

(Continued)

OTHER PUBLICATIONS

Corresponding Office Action issued by the EPO dated Nov. 13, 2013.
(Continued)

*Primary Examiner* — Son Le
*Assistant Examiner* — Brent J Andrews

(57) ABSTRACT

Disclosed is a capacitance sensor including: a capacitance-voltage/current converter which converts a capacitance value of a sense capacitor into a voltage signal or a current signal by using an input signal; a multiplier which applies a weight to an output signal of the capacitance-voltage/current converter and outputs the weighted output signal; and an accumulator which accumulates continuously the output signal of the multiplier.

21 Claims, 4 Drawing Sheets

(56) References Cited

U.S. PATENT DOCUMENTS

| | | | |
|---|---|---|---|
| 6,906,653 B2* | 6/2005 | Uno | G06G 7/14 |
| | | | 341/131 |
| 7,379,005 B2* | 5/2008 | Wiesbauer et al. | 341/144 |
| 8,493,331 B2 | 7/2013 | Krah et al. | |
| 2004/0081339 A1* | 4/2004 | Benkley, III | 382/124 |
| 2005/0217375 A1* | 10/2005 | Mase | G01P 15/125 |
| | | | 73/504.12 |
| 2008/0048997 A1 | 2/2008 | Gillespie et al. | |
| 2008/0309625 A1* | 12/2008 | Krah et al. | 345/173 |
| 2009/0066665 A1 | 3/2009 | Lee | |
| 2010/0110040 A1* | 5/2010 | Kim | G06F 3/0412 |
| | | | 345/174 |
| 2010/0327882 A1* | 12/2010 | Shahparnia et al. | 324/659 |
| 2011/0163994 A1* | 7/2011 | Tang | G06F 3/044 |
| | | | 345/174 |

FOREIGN PATENT DOCUMENTS

| | | |
|---|---|---|
| JP | H06-060689 | 3/1994 |
| KR | 100766627 | 10/2007 |
| KR | 10-2008-0109655 | 12/2008 |
| KR | 10-2009-0027066 | 3/2009 |

OTHER PUBLICATIONS

Corresponding Office Action issued by the EPO on Jul. 30, 2014.
Behzad Razavi, Design of Analog CMOS Intergrated Circuits, D6_Introduction to switched-capacitor circuits, pp. 405-447, McGraw-Hill Higher Education.
Corresponding Office Action issued by the EPO on Nov. 6, 2015.

* cited by examiner

CAPACITANCE SENSOR WITH IMPROVED NOISE FILTERING CHARACTERISTICS, METHOD FOR NOISE FILTERING OF CAPACITANCE SENSOR AND COMPUTER-READABLE RECORDING MEDIUM

CROSS-REFERENCE TO RELATED APPLICATIONS

This application claims the benefit of Korean Patent Application No. 10-2011-0061468, filed Jun. 24, 2011, the entirety of which is hereby incorporated by reference.

FIELD OF THE INVENTION

The present invention relates to a capacitance sensor with improved noise filtering characteristics, a method for noise filtering of capacitance sensor and a computer-readable recording medium.

BACKGROUND OF THE INVENTION

At present, various display devices with a touch screen are being widely used and are continuously being developed. The touch screen detects that an object touches a panel, converts the touch into an electrical signal and determines whether or not there is a user's input.

The touch screen has various types such as a resistive touch screen, a pressure sensitive touch screen, a surface capacitive touch screen. The resistive touch screen senses an input by measuring a resistance value change when an object touches the screen. The pressure sensitive touch screen senses an input by measuring a surface pressure variation when an object touches the screen. The surface capacitive touch screen senses an input by measuring a surface capacitance change when an object touches the screen.

Here, in the surface capacitive touch screen, it is important to accurately sense a capacitance change caused by the input from a user. For example, when a signal which should be detected as a user's input has a specific frequency, it is possible to accurately measure the capacitance change only when signals having different frequencies from the specific frequency are appropriately filtered.

SUMMARY OF THE INVENTION

One embodiment is a capacitance sensor including: a capacitance-voltage/current converter which converts a capacitance value of a sense capacitor into a voltage signal or a current signal by using an input signal; a multiplier which applies a weight to an output signal of the capacitance-voltage/current converter and outputs the weighted output signal; and an accumulator which accumulates continuously the output signal of the multiplier.

The capacitance-voltage/current converter and the multiplier includes: a first amplifier; a first switch which controls the on/off of the connection between an input terminal to which the input signal is applied and one end of the sense capacitor; a second switch which controls the on/off of the connection between the other end the sense capacitor and a ground; a third switch which controls the on/off of the connection between the one end of the sense capacitor and the ground; a fourth switch which controls the on/off of the connection between the other end of the sense capacitor and a first input terminal of the first amplifier; and a variable capacitor which is located between the first input terminal of the first amplifier and an output terminal of the first amplifier and is connected to the first input terminal of the first amplifier and the output terminal of the first amplifier, and which has a variable capacitance value. A second input terminal of the first amplifier may be connected to the ground. The output terminal of the first amplifier may be an output terminal of the multiplier.

The first switch and the second switch may be synchronized and may be in an ON or OFF state, and the third switch and the fourth switch may be synchronized and may be in an ON or OFF state. The third switch and fourth switch may be in an OFF-state during an ON-state of the first switch and the second switch, and the first switch and the second switch may be in an OFF-state during an ON-state of the third switch and fourth switch.

The first switch and the second switch may be in an ON-state during a time when a phase of a control signal is a first phase. The third switch and fourth switch may be in an ON-state during a time when the phase of the control signal is a second phase.

The capacitance sensor may further include a fifth switch which is synchronized with the first switch and the second switch and is in an ON or OFF state, and is located between and connected to both ends of the variable capacitor.

An electric charge may be charged in the sense capacitor by the input signal during an ON-state of the first switch and the second switch. The electric charge charged in the sense capacitor may be transferred to the variable capacitor during an ON-state of the third switch and fourth switch.

The accumulator includes: a sampling capacitor; a second amplifier; a sixth switch which controls the on/off of the connection between an output terminal of the multiplier and one end of the sampling capacitor; a seventh switch which controls the on/off of the connection between the other end of the sampling capacitor and a ground; a eighth switch which controls the on/off of the connection between the one end of the sampling capacitor and the ground; a ninth switch which controls the on/off of the connection between the other end of the sampling capacitor and a first input terminal of the second amplifier; and an accumulation capacitor which is located between and connected to the first input terminal of the second amplifier and an output terminal of the second amplifier. A second input terminal of the amplifier may be connected to the ground, and the output terminal of the amplifier may be an output terminal of the accumulator.

The sixth switch and the seventh switch may be synchronized and may be in an ON or OFF state, and the eighth switch and the ninth switch may be synchronized and may be in an ON or OFF state. The eighth switch and the ninth switch may be in an OFF-state during an ON-state of the sixth switch and seventh switch, and the sixth switch and seventh switch may be in an OFF-state during an ON-state of the eighth switch and the ninth switch.

The eighth switch and the ninth switch may be in an ON-state during a time when a phase of a control signal is a first phase. The sixth switch and seventh switch may be in an ON-state during a time when the phase of the control signal is a second phase.

The capacitance sensor may further include a tenth switch which is located between and connected to both ends of the accumulation capacitor, and is synchronized and is in an ON state during a time when a reset signal is applied.

An electric charge may be charged in the sampling capacitor by an output terminal voltage of the multiplier during an ON-state of the sixth switch and seventh switch. The electric charge charged in the sampling capacitor may be accumulated in the accumulation capacitor during an ON-state of the eighth switch and the ninth switch.

Another embodiment is capacitance sensor including: a capacitance-voltage/current converter which converts a capacitance value of a sense capacitor into a voltage signal or a current signal by using an input signal; a plurality of multiplier-holders which apply a weight to an output signal of the capacitance-voltage/current converter and outputs the weighted output signal; and an adder which adds up all of the output signals of a plurality of the multiplier-holders.

The capacitance-voltage/current converter may include a switch which controls the on/off of the connection between an input terminal to which the input signal is applied and one end of the sense capacitor. The other end of the sense capacitor may be connected to a ground.

An electric charge may be charged in the sense capacitor by the input signal during an ON-state of the switch.

Each of the multiplier-holders includes: a sampling capacitor of which one end is connected to a ground; an amplifier of which a first input terminal is connected to the other end of the sampling capacitor and of which a second input terminal is connected to an output terminal; and a switch which controls the on/off of the connection between an output terminal of the capacitance-voltage/current converter and the other end of the sampling capacitor. An output terminal of the amplifier may be an output terminal of each of the multiplier-holders.

At least two sampling capacitors included in each of the multiplier-holders may have mutually different capacitance values.

The switches included in each of the multiplier-holders may become in an ON-state at mutually different points of time.

An electric charge may be charged in the sampling capacitance by the voltage of the sense capacitor during an ON-state of the switch. A voltage value of both ends of the sampling capacitance may be transferred to the output terminal of each of the multiplier-holders.

The adder includes: pre-charge capacitors provided as many as the number of the multiplier-holders; one amplifier; a first pre-charge switch which controls the on/off of the connection between each of output terminals of the multiplier-holders and one end of each of the pre-charge capacitors; a second pre-charge switch which controls the on/off of the connection between the connection between the other end of each of the pre-charge capacitors and a ground; a first sum switch which controls the on/off of the one end of each of the pre-charge capacitors and the ground; a second sum switch which controls the on/off of the connection between the other end of each of the pre-charge capacitors and a first input terminal of the amplifier; and a sum capacitor which is located between and connected to the first input terminal of the amplifier and an output terminal. A second input terminal of the amplifier may be connected to the ground, and an output terminal of the amplifier may be an output terminal of the adder.

At least two pre-charge capacitors may have mutually different capacitance values.

The first pre-charge switch and the second pre-charge switch may be synchronized and may be in an ON or OFF state, and the first sum switch and the second sum switch may be synchronized and may be in an ON or OFF state. The first sum switch and the second sum switch may be in an OFF-state during an ON-state of the first pre-charge switch and the second pre-charge switch, and the first pre-charge switch and the second pre-charge switch may be in an OFF-state during an ON-state of the first sum switch and the second sum switch.

The first pre-charge switch and the second pre-charge switch may be in an ON-state during a time when a phase of a control signal is a first phase. The first sum switch and second sum switch may be in an ON-state during a time when the phase of the control signal is a second phase.

The capacitance sensor may further include a third pre-charge switch which is synchronized with the first pre-charge switch and the second pre-charge switch and is in an ON or OFF state, and is located between and connected to both ends of the sum capacitor.

An electric charge may be charged in each of the pre-charge capacitors by an output terminal voltage of each of a plurality of the multiplier-holders during an ON-state of the first pre-charge switch and the second pre-charge switch. The electric charge stored in each of the pre-charged capacitors may be all transferred to the sum capacitor and summed during an ON-state of the first sum switch and the second sum switch.

Further another embodiment is a noise filtering method of a capacitance sensor. The method includes: converting a capacitance value of a sense capacitor into an electrical signal related to the capacitance value by using an input signal; generating a plurality of samples by repeating a process of applying a weight to the electrical signal and outputting; and accumulating or adding up the plurality of the samples.

Yet another embodiment is either another method for performing the noise filtering method of the capacitance sensor or a computer-readable recording medium for recording a computer program for performing the noise filtering method of the capacitance sensor.

DETAILED DESCRIPTION OF THE INVENTION

Figure 1:
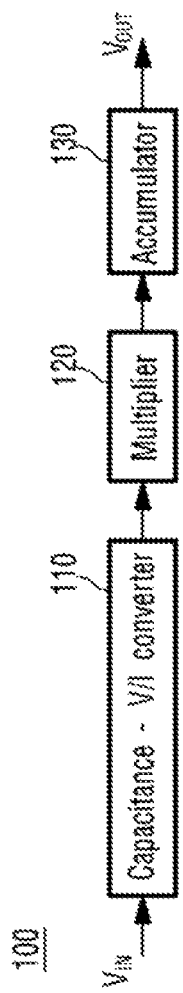
FIG. 1 is a block diagram showing a configuration of a capacitance sensor according to a first embodiment of the present invention.

The following detailed description of the present invention shows a specified embodiment of the present invention and will be provided with reference to the accompanying drawings. The embodiment will be described in enough detail that those skilled in the art are able to embody the present invention. It should be understood that various embodiments of the present invention are different from each other and need not be mutually exclusive. For example, a specific shape, structure and properties, which are described in this disclosure, may be implemented in other embodiments without departing from the spirit and scope of the present invention with respect to one embodiment. Also, it should be noted that positions or placements of individual components within each disclosed embodiment may be changed without departing from the spirit and scope of the present invention. Therefore, the following detailed description is not intended to be limited. If adequately described, the scope of the present invention is limited only by the appended claims of the present invention as well as all equivalents thereto. Similar reference numerals in the drawings designate the same or similar functions in many aspects.

Hereafter, exemplary embodiments of the present invention will be described in detail with reference to the accompanying drawings in order that the present invention may be easily implemented by those skilled in the art.

A capacitance sensor to be described below may be used in touch panels having a touch sensitive surface. When the touch panel is touched by an object (for example, a user's finger, a stylus pen or the like), the capacitance sensor may be used in a surface capacitive touch screen which senses an input through the change of the capacitance value present at a pixel. That is, the capacitance sensor of the present invention may be used as a circuit for measuring the capacitance change caused by the touch in the surface capacitive touch screen.

Logical Configuration of the Capacitance Sensor

FIG. 1 is a block diagram showing a configuration of a capacitance sensor according to a first embodiment of the present invention.

Referring to FIG. 1, a capacitance sensor 100 according to the first embodiment of the present invention includes a capacitance-voltage/current converter 110, a multiplier 120 and an accumulator 130.

The capacitance-voltage/current converter 110 according to the embodiment of the present invention functions to convert a capacitance value to be detected into a voltage signal or a current signal.

The multiplier 120 according to the embodiment of the present invention functions to apply a specific weight to the output signal of the capacitance-voltage/current converter 110. The weight may or may not have the same value every time.

The accumulator 130 according to the embodiment of the present invention functions to accumulate continuously the output signal of the multiplier 120.

$V_{IN}$ is an input signal of the capacitance-voltage/current converter 110. $V_{OUT}$ is an output signal of the capacitance-voltage/current converter 110.

For the purpose of the description of the operation of the capacitance sensor shown in FIG. 1, a relation between $V_{OUT}(nT)$ and $V_{IN}(nT)$ may be represented by the following equation (1):

$$V_{OUT}(nT)=a_1V_{IN}(nT-T)+a_2V_{IN}(nT-2T)+a_3V_{IN}(nT-3T)+\ldots+a_NV_{IN}(nT-NT) \quad \text{Equation (1)}$$

Equation (1) may be summarized as follows:

$$V_{OUT}(nT) = \sum_{i=1}^{N} a_i V_{IN}(nT - iT) \quad \text{Equation (2)}$$

Here, $a_1V_{IN}(nT-T)$ represents a first output signal and $a_2V_{IN}(nT-2T)$ represents a second output signal, $a_NV_{IN}(nT-NT)$ represents an $N^{th}$ output signal. All of the output signals are added by the accumulator 130 as shown in Equation (1). $a_1, a_2, \ldots, a_N$ are weights which are applied to the output signals respectively by the multiplier 120. Every time the output signal is generated by the capacitance-voltage/current converter 110, the multiplier 120 may apply the mutually different weights.

The characteristics shown in Equations (1) and (2) signify that the capacitance-voltage/current converter according to the embodiment of the present invention is able to function as a finite impulse response (FIR) filter. The FIR filter is a kind of a digital filter and performs a filtering process by means of only certain values of the input signal.

Referring to Equation (1), the desired characteristics of the filter can be obtained by applying mutually different weights to sample items respectively. For example, when relatively large weights are applied to the $(m-k)^{th}$ sample item to the $(m+k)^{th}$ sample item such that the largest weight is applied to the $m^{th}$ sample item and the weight becomes smaller with the increase of an interval from the $m^{th}$ sample item, it is possible to obtain a weight which particularly emphasizes only an item corresponding to the $m^{th}$ sample. Meanwhile, when the same weight (for example, "1") is applied to all the samples, it may be possible to obtain the same result as that obtained by applying a rectangular window in the FIR filter.

Figure 2:
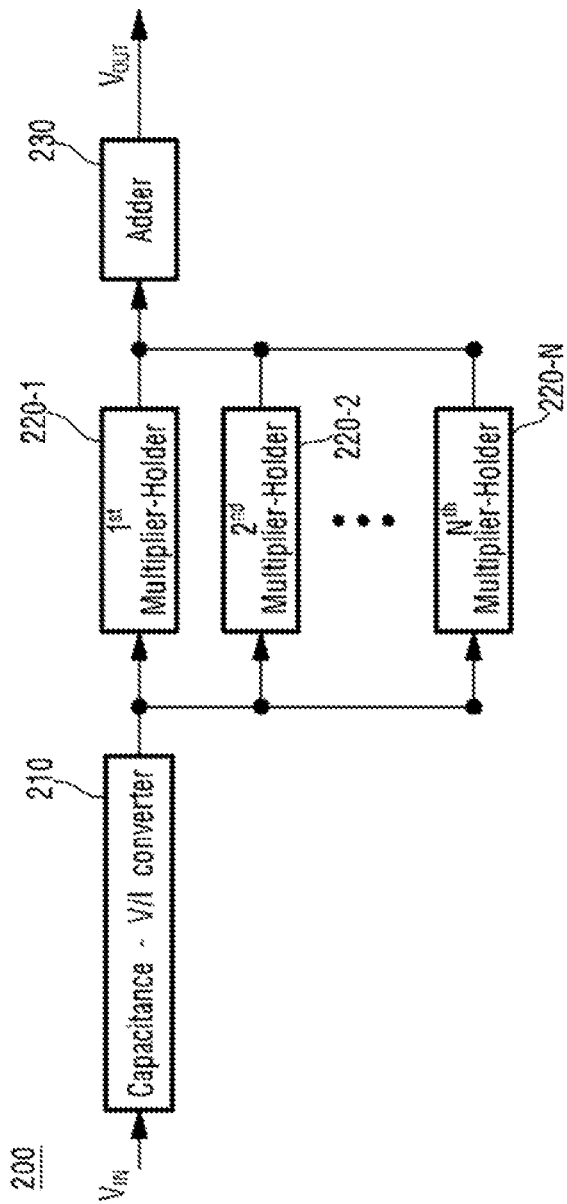
FIG. 2 is a block diagram showing a configuration of a capacitance sensor according to a second embodiment of the present invention.

FIG. 2 shows a configuration of a capacitance sensor according to a second embodiment of the present invention.

Referring to FIG. 2, a capacitance sensor 200 according to the second embodiment of the present invention includes a capacitance-voltage/current converter 210, a plurality of multiplier-holders 220-1, 220-1, ... and 220-N, and an adder 230.

The capacitance-voltage/current converter 210 has the same function as that of the capacitance-voltage/current converter 110 shown in FIG. 1. Therefore, a description of the capacitance-voltage/current converter 210 will be omitted.

The multiplier-holders 220-1, 220-2, ... and 220-N of which the number is the same as the number of the samples are provided. For example, when there are N samples, in other words, when N output signals of the capacitance-voltage/current converter 210 are generated, N capacitance-voltage/current converters 210 are provided. The multiplier-holders 220-1, 220-1, ... and 220-N apply weights to the samples respectively and hold values to which the weights are applied. The adder 230 adds up all of the values held by each of the multiplier-holders 220-1, 220-2, ... and 220-N.

A relation between the output signal $V_{OUT}$ and the input signal $V_{IN}$ of the capacitance sensor 200 of FIG. 2 according to the second embodiment of the present invention may be represented in the same manner as that of the capacitance sensor 100 of the first embodiment.

$$V_{OUT}(nT)=a_1V_{IN}(nT-T)+a_2V_{IN}(nT-2T)+a_3V_{IN}(nT-3T)+\ldots+a_NV_{IN}(nT-NT) \quad \text{Equation (3)}$$

A first multiplier-holder 220-1 applies a weight of "$a_1$" to "$V_{IN}(nT-T)$" of the first sample and holds it. A second multiplier-holder 220-2 applies a weight of "$a_2$" to "$V_{IN}(nT-2T)$" of the second sample and holds it. The $N^{th}$ multiplier-holder 220-N applies a weight of "$a_N$" to "$V_{IN}(nT-NT)$" of the first sample and holds it.

The adder 230 adds up all the sample items which have the weights applied thereto and is held by the multiplier-holders 220-1, 220-1, ... and 220-N. Then, a relation shown in Equation (3) is obtained.

Hereafter, described is an example in which the capacitance sensors 100 and 200 shown in FIGS. 1 and 2 are implemented by an analog circuit.

Implementation Example

Figure 3:
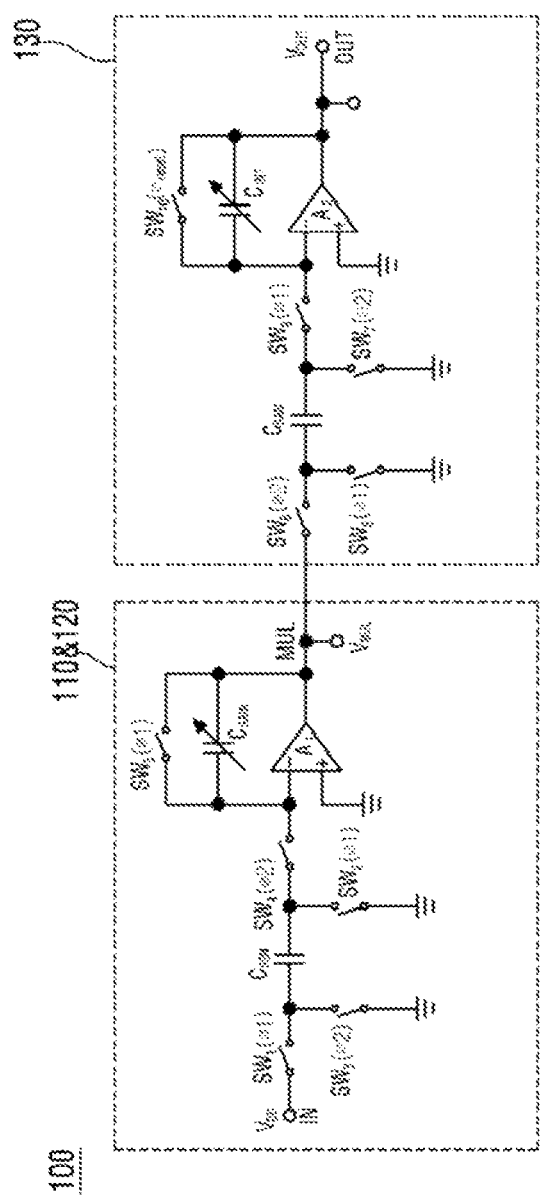
FIG. 3 is a circuit diagram showing that the capacitance sensor of FIG. 1 is implemented by an analog circuit.

FIG. 3 shows an example in which the capacitance sensor 100 of FIG. 1 according to the first embodiment of the present invention is implemented by an analog circuit. Referring to FIG. 3, the capacitance sensor 100 implemented by the analog circuit is divided into a part responsible for both the capacitance-voltage/current converter 110 and the multiplier 120, and a part responsible for the accumulator 130.

The part responsible for both the capacitance-voltage/current converter 110 and the multiplier 120 includes a sense capacitor $C_{SEN}$ which is an object of capacity detection, a first switch $SW_1$, a second switch $SW_2$ and a fifth switch $SW_5$ which are synchronized and are in an ON-state during a phase $\Phi 1$, a third switch $SW_3$ and a fourth switch $SW_4$ which are synchronized and are in an ON-state during a phase $\Phi 2$, a first amplifier $A_1$, and a variable capacitor $C_{GAIN}$.

The part responsible for the accumulator 130 includes an eighth switch $SW_8$ and a ninth switch $SW_9$ which are synchronized and are in an ON-state during the phase $\Phi 1$, a sixth switch $SW_6$ and a seventh switch $SW_7$ which are synchronized and are in an ON-state during the phase $\Phi 2$, a sampling capacitor $C_{SAM}$, an accumulation capacitor $C_{INT}$ in which electron charges are accumulated, a tenth switch $SW_{10}$ which is synchronized with a reset signal and is in an ON-state, and a second amplifier $A_2$.

The switch included in the entire capacitance sensor 100 may be on/off depending on the phase of a control signal. The first switch $SW_1$, second switch $SW_2$, fifth switch $SW_5$, eighth switch $SW_8$ and ninth switch $SW_9$ are synchronized and are in an ON-state during a time when the phase of the control signal is $\Phi 1$, and are in an OFF-state during the rest of the time period. The third switch $SW_3$, fourth switch $SW_4$, sixth switch $SW_6$ and seventh switch $SW_7$ are synchronized and are in an ON-state during a time when the phase of the control signal is $\Phi 2$, and are in an OFF-state during the rest of the time period. The tenth switch $SW_{10}$ is in an ON-state when the reset signal is applied, that is, during a time when the phase of the control signal is $\Phi_{reset}$ which performs a reset command, and is in an OFF-state during the rest of the time period. However, apart from the control signal, a separate reset signal controlling the tenth switch $SW_{10}$ may be used.

The first switch SW1 is connected to one end of the sense capacitor CSEN and an input terminal IN to which an input signal VDD is input. The second switch SW2 is located between the other end of the sense capacitor CSEN and ground and is connected to the other end of the sense capacitor CSEN and the ground. The third switch SW3 is located between the one end of the sense capacitor CSEN and the ground and is connected to the one end of the sense capacitor CSEN and the around. The fourth switch SW4 is connected to the other end of the sense capacitor CSEN and a first input terminal of the first amplifier A1. A second input terminal of the first amplifier A1 is connected to the ground. The first input terminal of the first amplifier A1 may be an inverting input terminal. The second input terminal of the first amplifier A1 may be a non-inverting input terminal. The fifth switch SW5 is located between the first input terminal of the first amplifier A1 and the input terminal MUL of the accumulator 130 and is connected to the first input terminal of the first amplifier A1 and the input terminal MUL of the accumulator 130. The variable capacitor CGAIN is also located between the first input terminal of the first amplifier A1 and the input terminal MUL of the accumulator 130 and is connected to the first input terminal of the first amplifier A1 and the input terminal MUL of the accumulator 130. The output terminal of the first amplifier A1 functions as both the output terminal of the multiplier 120 and the input terminal of the accumulator 130.

The sixth switch $SW_6$ is located between the input terminal MUL of the accumulator 130 and one end of the sampling capacitor $C_{SAM}$, is connected to the input terminal MUL of the accumulator 130 and one end of the sampling capacitor $C_{SAM}$. The seventh switch $SW_7$ is located between the other end of the sampling capacitor $C_{SAM}$ and the ground and is connected to the other end of the sampling capacitor $C_{SAM}$ and the ground. The eighth switch $SW_8$ is located between the one end of the sampling capacitor $C_{SAM}$ and the ground and is connected to the one end of the sampling capacitor $C_{SAM}$ and the ground. The ninth switch $SW_9$ is located between the other end of the sampling capacitor $C_{SAM}$ and a first input terminal of the second amplifier $A_2$ and is connected to the other end of the sampling capacitor $C_{SAM}$ and a first input terminal of the second amplifier $A_2$. A second input terminal of the second amplifier $A_2$ is connected to the ground. The first input terminal of the second amplifier $A_2$ may be an inverting input terminal. The second input terminal of the second amplifier $A_2$ may be a non-inverting input terminal. The tenth switch $SW_{10}$ is located between the first input terminal of the second amplifier $A_2$ and an output terminal OUT outputting the output signal $V_{OUT}$ and is connected to the first input terminal of the second amplifier $A_2$ and an output terminal OUT outputting the output signal $V_{OUT}$. The accumulation capacitor $C_{INT}$ is also located between the first input terminal of the second amplifier $A_2$ and the output terminal OUT of the accumulator 130 and is connected to the first input terminal of the second amplifier $A_2$ and the output terminal OUT of the accumulator 130. The output terminal OUT of the accumulator 130 functions as the output terminal of the entire capacitance sensor 100. The output terminal of the second amplifier $A_2$ corresponds to the output terminal OUT of the accumulator 130.

The operation of the capacitance sensor 100 shown in FIG. 3 will be described. The input signal $V_{DD}$ is applied to the input terminal IN. When the first switch $SW_1$, second switch $SW_2$ and fifth switch $SW_5$ are in an ON-state during a time when the phase of the control signal is $\Phi 1$, a voltage corresponding to the input signal $V_{DD}$ is applied to both ends of the sense capacitor $C_{SEN}$ because the input terminal IN-the first switch $SW_1$-the sense capacitor $C_{SEN}$-the second switch $SW_2$-the ground are connected. Therefore, electric charges are charged in the sense capacitor $C_{SEN}$ by the voltage. Meanwhile, since both ends of the variable capacitor $C_{GAIN}$ are short-circuited during a time when the fifth switch $SW_5$ is in an ON-state, electric charges are not charged in the variable capacitor $C_{GAIN}$.

Here, when the phase of the control signal is $\Phi 2$, the third switch $SW_3$ and fourth switch $SW_4$ become in an ON-state and the first switch $SW_1$, second switch $SW_2$ and fifth switch $SW_5$ become in an OFF-state during a time when the phase of the control signal is $\Phi 2$. Since one end of the sense capacitor $C_{SEN}$ is connected to the ground and the other end of the sense capacitor $C_{SEN}$ is connected to the inverting input terminal of the first amplifier $A_1$ connected to one end of the variable capacitor $C_{GAIN}$, the electric charges stored in the sense capacitor $C_{SEN}$ are transferred to the variable capacitor $C_{GAIN}$ during a time when the third switch $SW_3$ and fourth switch $SW_4$ are in an ON-state.

Electric charge quantity stored in the sense capacitor $C_{SEN}$ is equal to that transferred to the variable capacitor $C_{GAIN}$, the following equation is obtained:

$$C_{SEN}V_{DD}(nT-T)=C_{GAIN}(nT)V_{MUL}(nT) \quad \text{Equation (4)}$$

$V_{DD}(nT-iT)$ represents an $i^{th}$ input signal. Equation (4) shows a relation between the sense capacitor $C_{SEN}$ and the variable capacitor $C_{GAIN}$ when the $i^{th}$ input signal is applied.

Based on Equation (4), an input terminal voltage value of the accumulator 130 may be represented by the following Equation (5):

$$V_{MUL}(nT) = \frac{C_{SEN}}{C_{GAIN}(nT)} V_{DD}(nT - T) \quad \text{Equation (5)}$$

In the accumulator 130, when the phase of the control signal is Φ2, the sixth switch $SW_6$ and seventh switch $SW_7$ are in an ON-state. Accordingly, one end of the sampling capacitor $C_{SAM}$ is connected to the input terminal MUL of the accumulator 130 having a voltage value which is represented by Equation (5). The other end of the sampling capacitor $C_{SAM}$ is connected to the ground. Thus, the quantity of electric charges charged in the sampling capacitor $C_{SAM}$ may be represented by the following Equation (6):

$$Q_{SAM} = C_{SAM} V_{MUL}(nT) = \frac{C_{SAM} C_{SEN}}{C_{GAIN}(nT)} V_{DD}(nT - T) \quad \text{Equation (6)}$$

When the phase of the control signal is Φ1, the sixth switch $SW_6$ and seventh switch $SW_7$ are in an OFF-state and the eighth switch $SW_8$ and ninth switch $SW_9$ are in an ON-state. Accordingly, one end of the sampling capacitor $C_{SAM}$ is connected to the ground and the other end of the sampling capacitor $C_{SAM}$ is connected to the inverting input terminal of the second amplifier $A_2$ connected to one end of the accumulation capacitor $C_{INT}$. The electric charges stored in the sampling capacitor $C_{SAM}$ are transferred to the accumulation capacitor $C_{INT}$.

The tenth switch $SW_{10}$ which connects both ends of the accumulation capacitor $C_{INT}$ always remains in an OFF-state so long as the reset signal is not inputted. Therefore, the both ends of the accumulation capacitor $C_{INT}$ are not short-circuited and the electric charges transferred from the sampling capacitor $C_{SAM}$ are accumulatively stored in the accumulation capacitor $C_{INT}$.

The quantity of the electric charges stored in the sampling capacitor $C_{SAM}$ is equal to the quantity of the electric charges transferred to the accumulation capacitor $C_{INT}$. The electric charges are continuously charged in the accumulation capacitor $C_{INT}$. Therefore, the following equation can be obtained. It is assumed that the electric charges are charged N times in the accumulation capacitor $C_{INT}$ by performing repeatedly the above-mentioned operation N times.

$$V_{OUT}(nT) = \frac{C_{SAM}}{C_{INT}} \left\{ \begin{array}{c} V_{MUL}(nT - T) + \\ V_{MUL}(nT - 2T) + \ldots + V_{MUL}(nT - NT) \end{array} \right\} \quad \text{Equation (7)}$$

$$= \frac{C_{SAM} C_{SEN}}{C_{INT}} \sum_{i=1}^{N} \frac{V_{DD}(nT - iT - T)}{C_{GAIN}(nT - iT)}$$

Through a comparison of Equation (7) with Equation (2), it can be seen that a value corresponding to $a_i$ is $$\frac{C_{SAM} C_{SEN}}{C_{INT} C_{GAIN}(nT - iT)}, \text{ and } \frac{1}{C_{GAIN}(nT - iT)}$$

is a variable value. That is, the $a_i$ of the FIR filter, which is represented by Equation (2), can be programmed by controlling a capacitance value of the variable capacitor $C_{GAIN}$.

Accordingly, a FIR filter having desired characteristics can be obtained by means of the analog circuit.

Figure 4:
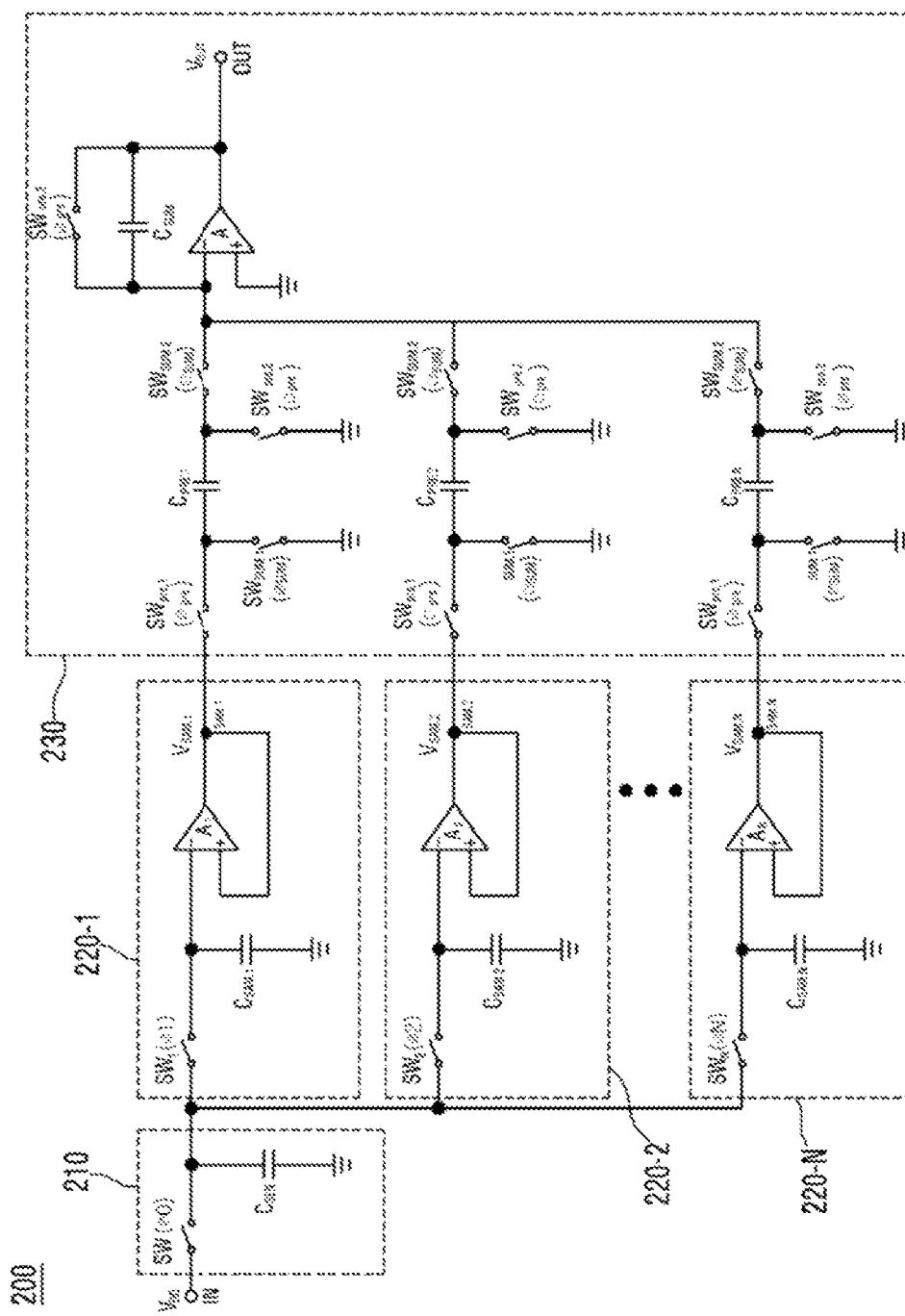
FIG. 4 is a circuit diagram showing that the capacitance sensor of FIG. 2 is implemented by an analog circuit.

FIG. 4 is a circuit diagram showing that the capacitance sensor 200 of FIG. 2 according to the second embodiment of the present invention is implemented by an analog circuit. Referring to FIG. 4, the capacitance sensor 200 implemented by the analog circuit is divided into a part responsible for the capacitance-voltage/current converter 210, parts responsible for a plurality of the multiplier-holders 220-1, 220-2, . . . and 220-N, and a part responsible for the adder 230.

The part responsible for the capacitance-voltage/current converter 210 includes the sense capacitor $C_{SEN}$ and a switch SW controlling the on/off of the connection between the input terminal IN and one end of the sense capacitor $C_{SEN}$. The switch SW is in an ON-state during a time when the phase of the control signal is Φ0.

Each of the parts responsible for a plurality of the multiplier-holders 220-1, 220-1, . . . and 220-N includes one of the sampling capacitors $C_{SAM,1}$, . . . and $C_{SAM,N}$, one of the amplifiers $A_1$, . . . and $A_N$ and one of the switches $SW_1$, $SW_2$, . . . and $SW_N$.

The responsible for the adder 230 includes pre-charge capacitors $C_{PRE,1}$, $C_{PRE,2}$, . . . and $C_{PRE,N}$ which are provided as many as the number of the multiplier-holders 220-1, 220-2, . . . and 220-N and are connected to or disconnected from the output terminals SAM,1, SAM,2, . . . and SAM,N of the multiplier-holders 220-1, 220-2, . . . and 220-N respectively, a first pre-charge switch $SW_{pre,1}$ which is provided as many as the number of the multiplier-holders 220-1, 220-2, . . . and 220-N and controls the on/off the connection between the output terminals SAM,1, SAM,2, . . . and SAM,N of the multiplier-holders 220-1, 220-2, . . . and 220-N and one ends of the pre-charge capacitors $C_{PRE,1}$, $C_{PRE,2}$, . . . and $C_{PRE,N}$, a second pre-charge switch $SW_{pre,2}$ which is provided as many as the number of the multiplier-holders 220-1, 220-2, . . . and 220-N and controls the on/off the connection between the ground and the other ends of the pre-charge capacitors $C_{PRE,1}$, $C_{PRE,2}$, . . . and $C_{PRE,N}$, a first sum switch $SW_{SUM,1}$ which controls the on/off of the connection between the ground and the one end of each of the pre-charge capacitors $C_{PRE,1}$, $C_{PRE,2}$, . . . and $C_{PRE,N}$, a second sum switch $SW_{SUM,2}$ which controls the on/off of the connection between the other end of each of the pre-charge capacitors $C_{PRE,1}$, $C_{PRE,2}$, . . . and $C_{PRE,N}$ and the first input terminal of the amplifier A, a sum capacitor $C_{SUM}$ which is located between the first input terminal of the amplifier A and the output terminal OUT and is connected to the first input terminal of the amplifier A and the output terminal OUT, and a third pre-charge switch $SW_{pre,3}$ which controls the on/off of the connection between both ends of the sum capacitor $C_{SUM}$. The second input terminal of the amplifier A may be connected to the ground. The output terminal may function as an output terminal OUT of the circuit of the entire capacitance sensor 200. The first input terminal may be an inverting output terminal. The second input terminal may be a non-inverting output terminal.

The first to the third pre-charge switches $SW_{pre,1}$, $SW_{pre,2}$ and $SW_{pre,3}$ are synchronized and are in an ON-state during a time when the phase of the control signal is $\Phi_{pre}$. The first and the second sum switches $SW_{SUM,1}$ and $SW_{SUM,2}$ are synchronized and are in an ON-state during a time when the phase of the control signal is $\Phi_{SUM}$.

The switch SW of the capacitance-voltage/current converter 210 becomes in an ON-state during a time when the phase of the control signal is Φ0 so that the sense capacitor $C_{SEN}$ is charged by the input signal $V_{DD}$ which is inputted to the input terminal IN. The quantity of the electric charges which are charged in the sense capacitor $C_{SEN}$ is represented by the following equation:

$$Q_{SEN} = C_{SEN} V_{DD} \qquad \text{Equation (8)}$$

Meanwhile, the first switch $SW_1$ of the first multiplier-holder 220-1 becomes in an ON-state during a time when the phase of the control signal is $\Phi 1$. Since the sense capacitor $C_{SEN}$ and the first sampling capacitor $C_{SAM,1}$ are connected with each other to have the ground placed therebetween, the sense capacitor $C_{SEN}$ shares the electric charges charged in the sense capacitor $C_{SEN}$ with the first sampling capacitor $C_{SAM,1}$. The non-inverting input terminal of the first amplifier $A_1$ is connected to one end of the first sampling capacitor $C_{SAM,1}$. The inverting input terminal of the first amplifier $A_1$ is connected to the output terminal of the first amplifier $A_1$, i.e., the output terminal SAM,1 of the first multiplier-holder 220-1. Since a voltage which is applied to the first sampling capacitor $C_{SAM,1}$ and the sense capacitor $C_{SEN}$ during a time when the first switch $SW_1$ is in an ON-state becomes equal to the output terminal voltage $V_{SAM,1}$ of the first multiplier-holder 220-1, the charge sharing of the sense capacitor $C_{SEN}$ and the first sampling capacitor $C_{SAM,1}$ may be represented by the following equation:

$$Q_{SEN} = (C_{SEN} + C_{SAM,1}) V_{SAM,1} \qquad \text{Equation (9)}$$

Therefore, the output terminal voltage $V_{SAM,1}$ of the first multiplier-holder 220-1 may be represented by the following equation:

$$V_{SAM,1}(nT) = \frac{Q_{SEN}}{C_{SEN} + C_{SAM,1}} = \frac{C_{SEN} V_{DD}(nT - T)}{C_{SEN} + C_{SAM,1}} \qquad \text{Equation (10)}$$

The second switch $SW_2$ of the second multiplier-holder 220-2 becomes in an ON-state during a time when the phase of the control signal is $\Phi 2$. The second multiplier-holder 220-2 performs the same operation as that of the first multiplier-holder 220-1. The output terminal voltage $V_{SAM,2}$ of the second multiplier-holder 220-2 may be represented by the following equation:

$$V_{SAM,2}(nT) = \frac{Q_{SEN}}{C_{SEN} + C_{SAM,2}} = \frac{C_{SEN} V_{DD}(nT - T)}{C_{SEN} + C_{SAM,2}} \qquad \text{Equation (11)}$$

In this manner, the output terminal voltage $V_{SAM,N}$ of the $N^{th}$ multiplier-holder 220-N may be represented by the following equation:

$$V_{SAM,N}(nT) = \frac{Q_{SEN}}{C_{SEN} + C_{SAM,N}} \qquad \text{Equation (12)}$$

$$= \frac{C_{SEN} V_{DD}(nT - NT)}{C_{SEN} + C_{SAM,N}}$$

Meanwhile, the operation of the adder 230 will be provided. The first to the third pre-charge switches $SW_{pre,1}$, $SW_{pre,2}$ and $SW_{pre,3}$ become in an ON-state during a time when the phase of the control signal is $\Phi_{pre}$. The output terminal voltages $V_{SAM,1}, V_{SAM,2}, \ldots$ and $V_{SAM,N}$ of the multiplier-holders 220-1, 220-2, and 220-N are applied to the pre-charge capacitors $C_{PRE,1}, C_{PRE,2}, \ldots$ and $C_{PRE,N}$ respectively.

Accordingly, as the first pre-charge switch $SW_{pre,1}$ becomes in an ON-state, the quantity of electric charges charged in the pre-charge capacitor $C_{PRE,i}$ connected to the output terminal of the $i^{th}$ multiplier-holder is represented by the following equation:

$$Q_{PRE,1} = C_{PRE,i} V_{SAM,i} \qquad \text{Equation (13)}$$

Meanwhile, when the phase of the control signal is $\Phi SUM$, the first and the second sum switches SWSUM,1 and SWSUM,2 become in an ON-state. Thus, one end of each of the pre-charge capacitors CPRE,1, CPRE,2, ... and CPRE,N is connected to the ground, and the other ends of each of the pre-charge capacitors CPRE,1, CPRE,2, ... and CPRE,N is connected to the inverting input terminal of the amplifier A. Also, since both ends of the sum capacitor CSUM is located between the inverting input terminal of the amplifier A and the output terminal OUT and is connected to the inverting input terminal of the amplifier A and the output terminal OUT, the electric charges stored in each of the pre-charge capacitors CPRE,1, CPRE,2, ... and CPRE,N are all transferred to the sum capacitor CSUM and summed.

Accordingly, the following equation is obtained:

$$C_{SUM} V_{OUT}(nT) = C_{PRE,1} V_{SAM,1}(nT-T) + C_{PRE,2} V_{SAM,2}(nT-T) + \ldots + C_{PRE,N} V_{SAM,N}(nT-T) \qquad \text{Equation (14)}$$

As a result, the output voltage $V_{OUT}$ of the capacitance sensor 200 is represented by the following equation:

$$V_{OUT}(nT) = \sum_{i=1}^{N} \frac{C_{PRE,i} V_{SAM,i}(nT - T)}{C_{SUM}} \qquad \text{Equation (15)}$$

By using Equation (12), the output voltage $V_{OUT}$ is summarized as follows:

$$V_{OUT}(nT) = \sum_{i=1}^{N} \frac{C_{PRE,i}}{C_{SUM}} \frac{C_{SEN}}{C_{SEN} + C_{SAM,i}} V_{DD}(nT - iT - T) \qquad \text{Equation (16)}$$

Through a comparison of Equation (16) with Equation (2), it can be seen that a value corresponding to $a_i$ is $$\frac{C_{PRE,i}}{C_{SUM}} \frac{C_{SEN}}{C_{SEN} + C_{SAM,i}},$$

and $C_{PRE,i}$ and $C_{SAM,i}$ are variable values. That is, the $a_i$ of the FIR filter, which is represented by Equation (2), can be programmed by controlling a capacitance value of each pre-charge capacitor $C_{PRE,i}$ and a capacitance value of each sampling capacitor $C_{SAM,i}$. The $a_i$ can be programmed by differentiating at least two capacitance values of the sampling capacitors $C_{SAM,1}, C_{SAM,2}, \ldots$ and $C_{SAM,N}$ which are respectively included in the multiplier-holders 220-1, 220-2, ... and 220-N, and by differentiating at least two capacitance values of the pre-charge capacitors $C_{PRE,1}$, $C_{PRE,2}, \ldots$ and $C_{PRE,N}$. Accordingly, a FIR filter having desired characteristics can be obtained by means of the analog circuit.

While the case in which the capacitance sensor according to the embodiment of the present invention is implemented by the analog circuit has been described in the foregoing, it goes without saying that the capacitance sensor shown in FIGS. 1 and 2 can be implemented by an analog circuit different from the analog circuit. In other words, a multiplier or a multiplier-holder which applies a specific weight to each sample, and an adder or an accumulator which adds or accumulates each of the weighted samples are implemented through the use of a conventional method for implementing an analog circuit, so that it is also possible to implement the capacitance sensor according to the embodiment of the present invention.

The foregoing embodiments of the present invention may be implemented in the form of a program instruction which is executable by various computer components and may be recorded in a computer-readable recording medium. The computer-readable recording medium may include program instructions, data files, data structures and the like separately or in a combination thereof. The program instructions recorded in the computer-readable recording medium may be specially designed and configured for the purpose of the present invention or may be well-known and available to those skilled in the field of computer software. A magnetic medium such as a hard disk, a floppy disk and a magnetic disk, an optical recording medium such as a CD-ROM and DVD, a magnetic-optical medium such as a floptical disk, and a hardware device such as ROM, RAM, a flash memory and the like, which is specially configured to store and run program instructions are included as examples of the computer-readable recording medium. Not only a machine language code which is formed by a complier but also high-level language code which can be executed by a computer using an interpreter is included as examples of the program instruction. The hardware device may be configured to operate as one or more software modules in order to perform the processes according to the present invention, and vice versa.

The features, structures and effects and the like described in the embodiments are included in at least one embodiment of the present invention and are not necessarily limited to one embodiment. Furthermore, the features, structures, effects and the like provided in each embodiment can be combined or modified in other embodiments by those skilled in the art to which the embodiments belong. Therefore, contents related to the combination and modification should be construed to be included in the scope of the present invention.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A capacitance sensor comprising:
    a capacitance-voltage/current converter which converts a capacitance value of a sense capacitor into a voltage signal or a current signal by using an input signal;
    a multiplier which applies one of a plurality of weights, each weight being different from the other weights, to each of a plurality of output signals of the capacitance-voltage/current converter with respect to the sense capacitor and outputs a plurality of weighted samples; and
    an accumulator which accumulates continuously the weighted samples of the multiplier;
    wherein the capacitance-voltage/current converter and the multiplier comprises:
        a first amplifier;
        a first switch which controls the on/off of the connection between an input terminal to which the input signal is applied and one end of the sense capacitor;
        a second switch which controls the on/off of the connection between the other end of the sense capacitor and a ground;
        a third switch which controls the on/off of the connection between the one end of the sense capacitor and the ground;
        a fourth switch which controls the on/off of the connection between the other end of the sense capacitor and a first input terminal of the first amplifier; and
        a variable capacitor which is located between the first input terminal of the first amplifier and an output terminal of the first amplifier and is connected to the first input terminal of the first amplifier and the output terminal of the first amplifier, and which has a variable capacitance value,
    wherein a second input terminal of the first amplifier is connected to the ground and wherein the output terminal of the first amplifier is an output terminal of the multiplier; and
    wherein the accumulator comprises:
        a sampling capacitor;
        a second amplifier;
        a sixth switch which controls the on/off of the connection between an output terminal of the multiplier and one end of the sampling capacitor;
        a seventh switch which controls the on/off of the connection between the other end of the sampling capacitor and a ground;
        an eighth switch which controls the on/off of the connection between the one end of the sampling capacitor and the ground;
        a ninth switch which controls the on/off of the connection between the other end of the sampling capacitor and a first input terminal of the second amplifier; and
        an accumulation capacitor which is located between and connected to the first input terminal of the second amplifier and an output terminal of the second amplifier,
    wherein a second input terminal of the second amplifier is connected to the ground, and the output terminal of the second amplifier is an output terminal of the accumulator.

2. The capacitance sensor of claim 1, wherein the first switch and the second switch are synchronized and are in an ON or OFF state, and the third switch and the fourth switch are synchronized and are in an ON or OFF state, and wherein the third switch and fourth switch are in an OFF-state during an ON-state of the first switch and the second switch, and the first switch and the second switch are in an OFF-state during an ON-state of the third switch and fourth switch.

3. The capacitance sensor of claim 2, wherein the first switch and the second switch are in an ON-state during a time when a phase of a control signal is a first phase, wherein the third switch and fourth switch are in an ON-state during a time when the phase of the control signal is a second phase, and wherein the capacitance sensor functions as a filter.

4. The capacitance sensor of claim 2, further comprising a fifth switch which is synchronized with the first switch and the second switch and is in an ON or OFF state, and is located between and connected to both ends of the variable capacitor.

5. The capacitance sensor of claim 2, wherein an electric charge is charged in the sense capacitor by the input signal during an ON-state of the first switch and the second switch, and wherein the electric charge charged in the sense capacitor is transferred to the variable capacitor during an ON-state of the third switch and fourth switch.

6. The capacitance sensor of claim 1, wherein the sixth switch and the seventh switch are synchronized and are in an ON or OFF state, and the eighth switch and the ninth switch are synchronized and are in an ON or OFF state, and wherein the eighth switch and the ninth switch are in an OFF-state during an ON-state of the sixth switch and seventh switch, and the sixth switch and seventh switch are in an OFF-state during an ON-state of the eighth switch and the ninth switch.

7. The capacitance sensor of claim 6, wherein the eighth switch and the ninth switch are in an ON-state during a time when a phase of a control signal is a first phase, and wherein the sixth switch and seventh switch are in an ON-state during a time when the phase of the control signal is a second phase.

8. The capacitance sensor of claim 6, further comprising a tenth switch which is located between and connected to both ends of the accumulation capacitor, and is synchronized and is in an ON state during a time when a reset signal is applied.

9. The capacitance sensor of claim 6, wherein an electric charge is charged in the sampling capacitor by an output terminal voltage of the multiplier during an ON-state of the sixth switch and seventh switch, and wherein the electric charge charged in the sampling capacitor is accumulated in the accumulation capacitor during an ON-state of the eighth switch and the ninth switch.

10. A capacitance sensor comprising:
a capacitance-voltage/current converter which converts a capacitance value of a sense capacitor into a voltage signal or a current signal by using an input signal;
a plurality of multiplier-holders each of which applies one of a plurality of weights, each weight being different from the other weights, to one of a plurality of output signals of the capacitance-voltage/current converter with respect to the sense capacitor and outputs a weighted sample; and
an adder which adds up all of the weighted samples of the plurality of the multiplier-holders;
wherein the capacitance-voltage/current converter comprises a switch which controls the on/off of the connection between an input terminal to which the input signal is applied and one end of the sense capacitor, and wherein the other end of the sense capacitor is connected to a ground;
wherein each of the multiplier-holders comprises:
a sampling capacitor of which one end is connected to a ground;
a first amplifier of which a first input terminal is connected to the other end of the sampling capacitor and of which a second input terminal is connected to an output terminal; and
a switch which controls the on/off of the connection between an output terminal of the capacitance-voltage/current converter and the other end of the sampling capacitor,
wherein an output terminal of the first amplifier is an output terminal of each of the multiplier-holders; and
wherein the adder comprises:
pre-charge capacitors provided as many as the number of the multiplier-holders;
a second amplifier;
a first pre-charge switch which controls the on/off of the connection between each of output terminals of the multiplier-holders and one end of each of the pre-charge capacitors;
a second pre-charge switch which controls the on/off of the connection between the connection between the other end of each of the pre-charge capacitors and a ground;
a first sum switch which controls the on/off of the one end of each of the pre-charge capacitors and the ground;
a second sum switch which controls the on/off of the connection between the other end of each of the pre-charge capacitors and a first input terminal of the second amplifier; and
a sum capacitor which is located between and connected to the first input terminal of the second amplifier and an output terminal;
wherein a second input terminal of the second amplifier is connected to the ground, and an output terminal of the second amplifier is an output terminal of the adder.

11. The capacitance sensor of claim 10, wherein an electric charge is charged in the sense capacitor by the input signal during an ON-state of the switch.

12. The capacitance sensor of claim 10, wherein at least two sampling capacitors included in each of the multiplier-holders have mutually different capacitance values.

13. The capacitance sensor of claim 10, wherein the switches included in each of the multiplier-holders become in an ON-state at mutually different points of time.

14. The capacitance sensor of claim 10, wherein an electric charge is charged in the sampling capacitance by the voltage of the sense capacitor during an ON-state of the switch, and wherein a voltage value of both ends of the sampling capacitance is transferred to the output terminal of each of the multiplier-holders.

15. The capacitance sensor of claim 10, wherein at least two pre-charge capacitors have mutually different capacitance values.

16. The capacitance sensor of claim 10, wherein the first pre-charge switch and the second pre-charge switch are synchronized and are in an ON or OFF state, and the first sum switch and the second sum switch are synchronized and are in an ON or OFF state, and wherein the first sum switch and the second sum switch are in an OFF-state during an ON-state of the first pre-charge switch and the second pre-charge switch, and the first pre-charge switch and the second pre-charge switch are in an OFF-state during an ON-state of the first sum switch and the second sum switch.

17. The capacitance sensor of claim 16, wherein the first pre-charge switch and the second pre-charge switch are in an ON-state during a time when a phase of a control signal is a first phase, wherein the first sum switch and second sum switch are in an ON-state during a time when the phase of the control signal is a second phase.

18. The capacitance sensor of claim 16, further comprising a third pre-charge switch which is synchronized with the first pre-charge switch and the second pre-charge switch and is in an ON or OFF state, and is located between and connected to both ends of the sum capacitor.

19. The capacitance sensor of claim 16, wherein an electric charge is charged in each of the pre-charge capacitors by an output terminal voltage of each of a plurality of the multiplier-holders during an ON-state of the first pre-charge switch and the second pre-charge switch, and wherein the electric charge stored in each of the pre-charged capacitors are all transferred to the sum capacitor and summed during an ON-state of the first sum switch and the second sum switch.

20. A noise filtering method of a capacitance sensor, the method comprising:
- converting a capacitance value of a sense capacitor into an electrical signal related to the capacitance value by using an input signal and a capacitance-voltage/current converter;
- generating a plurality of weighted samples using a multiplier by performing a plurality of processes, each of which applies one of a plurality of weights, each weight being different from the other weights, to one of a plurality of output signals obtained from the electrical signal of the converting with respect to the sense capacitor and outputting; and
- accumulating or adding up the plurality of the weighted samples using an accumulator;
- wherein the capacitance-voltage/current converter and the multiplier comprises:
  - a first amplifier;
  - a first switch which controls the on/off of the connection between an input terminal to which the input signal is applied and one end of the sense capacitor;
  - a second switch which controls the on/off of the connection between the other end of the sense capacitor and a ground;
  - a third switch which controls the on/off of the connection between the one end of the sense capacitor and the ground;
  - a fourth switch which controls the on/off of the connection between the other end of the sense capacitor and a first input terminal of the first amplifier; and
  - a variable capacitor which is located between the first input terminal of the first amplifier and an output terminal of the first amplifier and is connected to the first input terminal of the first amplifier and the output terminal of the first amplifier, and which has a variable capacitance value,
- wherein a second input terminal of the first amplifier is connected to the ground and wherein the output terminal of the first amplifier is an output terminal of the multiplier; and
- wherein the accumulator comprises:
  - a sampling capacitor;
  - a second amplifier;
  - a sixth switch which controls the on/off of the connection between an output terminal of the multiplier and one end of the sampling capacitor;
  - a seventh switch which controls the on/off of the connection between the other end of the sampling capacitor and a ground;
  - an eighth switch which controls the on/off of the connection between the one end of the sampling capacitor and the ground;
  - a ninth switch which controls the on/off of the connection between the other end of the sampling capacitor and a first input terminal of the second amplifier; and
  - an accumulation capacitor which is located between and connected to the first input terminal of the second amplifier and an output terminal of the second amplifier,
- wherein a second input terminal of the second amplifier is connected to the ground, and the output terminal of the second amplifier is an output terminal of the accumulator.

21. A non-transitory computer-readable recording medium for recording a computer program for performing the method of claim 20.

* * * * *